United States Patent [19]

Bicknell et al.

[11] Patent Number: 4,678,990

[45] Date of Patent: Jul. 7, 1987

[54] MOTOR MONITOR SIGNAL ANALYSIS SYSTEM

[75] Inventors: John Bicknell, Rudgwick; Stephen O'Brien, Horsham, both of England

[73] Assignee: Bonar Bray Limited, Hertfordshire, England

[21] Appl. No.: 795,197

[22] Filed: Nov. 5, 1985

[30] Foreign Application Priority Data

Nov. 8, 1984 [GB] United Kingdom ................ 8428199

[51] Int. Cl.[4] ..................... G01R 31/12; G01R 23/16; G01R 23/00
[52] U.S. Cl. .......................... 324/158 MG; 324/77 B; 364/485
[58] Field of Search ........... 324/158 MG, 77 D, 77 B; 364/484, 485; 340/648; 322/99

[56] References Cited

U.S. PATENT DOCUMENTS 4,156,846  5/1979  Harrold et al. ............. 324/158 MG

OTHER PUBLICATIONS

Muniappan et al; "Microprocessor-Based Walsh-Fourier Spectral Analyzer"; *IEEE Transactions on Instrumentaton and Measurement;* vol. IM-28, No. 4; Dec. 1979; pp. 295-297.

*Primary Examiner*—Ernest F. Karlsen
*Assistant Examiner*—Vinh P. Nguyen
*Attorney, Agent, or Firm*—Freilich, Hornbaker, Rosen & Fernandez

[57] ABSTRACT

A signal analysis system for a magnetic field motor monitor utilizes an analog-to-digital converter for sampling the motor magnetic field at accurately determined and equally spaced times synchronized with the line frequency driving the motor. A plurality of separate memories are provided to accumulate the respective samples which are added to or subtracted from the contents of respective memories, depending on which of the samples is being processed as indicated by control bits in a status register. Signals indicative of the amplitudes of respective harmonically related frequency components of the motor magnetic field are provided from the contents of the memories by combining the respective in phase and quadrature values. A monitor provides an indication of when there has been a change in these combined signals.

10 Claims, 4 Drawing Figures

MOTOR MONITOR SIGNAL ANALYSIS SYSTEM

This invention relates to apparatus for monitoring the performance of an electric motor.

It is known to monitor the performance of an electric motor by detecting stray magnetic flux from the motor and providing corresponding electrical signals, performing a frequency analysis of the flux signals and providing diagnostic information in dependence on variations in the flux signals. For example, for a motor powered by a 50 Hz supply, the amplitude of the flux signal components at 25, 50, 100 and 150 Hz can be monitored and an alarm provided in the event of a large and sudden change. The amplitude of one or more of these components might change by of the order of 100 times when a major fault occurs, such as incipient rotor bar fracture. A known frequency analysis system employs narrow band filters for separating the individual frequency components. However, such devices are costly and are subject to performance degradation with changing temperature and with age; they also require extensive calibration by skilled personnel. Another known system involves sampling the magnetic flux to determine its amplitude at a number of points within a line (mains) cycle and processing the samples with a digital processor to determine the amplitudes of the individual frequency components of interest. Known digital techniques employ correlation or fast Fourier transforms. Apparatus using these techniques is costly because of the storage requirements and high speed arithmetic multiplication functions which must be carried out.

It is an object of this invention to provide a motor monitor which is reliable and effective but of low cost.

According to the invention there is provided a magnetic field motor monitor having a signal analysis system comprising means for taking instantaneous samples of the motor magnetic field at accurately determined and equally spaced times synchronised with the line frequency driving the motor, a plurality of separate memories, means for adding the current instantaneous sample value to or subtracting it from the contents of each separate memory, addition or subtraction taking place in dependence on which of the samples is being processed, and means for providing from the contents of the memories signals indicative of the amplitudes of respective harmonically related frequency components of the motor magnetic field. A fixed number of equally spaced samples are taken in each cycle of the line supply or a sub-harmonic thereof, and the number of the sample within the sequence determines whether addition or subtraction should take place into the respective memories. Since only addition and subtraction operations are performed, the apparatus can be constructed using simple components of low cost.

The number of memories is preferably twice the number of frequency components the amplitudes of which are to be determined and the system includes means for providing from the contents of the memories signals representing in-phase and quadrature components of these frequencies and for determining the modulus of the in-phase and quadrature components. Preferably, eight memories are provided, the accumulated memory contents representing the in-phase and quadrature components of four harmonically-related frequencies. The frequencies are preferably 0.5, 1, 2 and 3 times the line frequency, i.e. 25, 50, 100 and 150 Hz for a 50 Hz line frequency or 30, 60, 120 and 180 Hz for a 60 Hz line frequency and in order to provide sufficient accuracy a minimum of 48 samples are preferably taken in each sequence, i.e. samples are taken every 833 microseconds (50 Hz) or every 694 microseconds (60 Hz).

The memories are preferably digital memories, and an analogue-to-digital converter is provided to convert sampled instantaneous values of the flux into corresponding digital values.

Whether the samples are added to or subtracted from the respective memories is preferably determined by a circuit which has the effect of multiplying the samples by the appropriate set of Walsh functions. For example, the 1st to 24th samples might be added to the first register which represents the in-phase component at the fundamental frequency, and the 25th to 48th samples subtracted therefrom. For the quadrature component at the fundamental frequency samples 13 to 36 would be added to the second memory and samples 1 to 12 and 37 to 38 subtracted therefrom. Similarly, for the in-phase component of the sixth harmonic, samples 1 to 4, 9 to 12, 17 to 20, 25 to 28, 33 to 36 and 41 to 44 would be added to the seventh memory and samples 5 to 8, 13 to 16, 21 to 24, 29 to 32, 37 to 40 and 45 to 48 would be subtracted therefrom.

Preferably a register having the same number of bits as there are memories is arranged to hold a status word the individual bits of which represent whether the next sample is to be added or subtracted into the respective registers. At each sample point one or more of the bits may be changed so that addition or subtraction into the memories takes place as appropriate. This arrangement has the advantage that the status word can control the addition or subtraction operation in a simple logical manner and the circuit can be implemented simply.

The contents of the memories may represent respective in-phase and quadrature components of single ones of the chosen harmonically related frequencies; however, it is within the scope of the invention for one or more of the memories to accumulate a value dependent on more than one of the frequency components. For example, where two frequency components have an odd harmonic relation, such as the fundamental and the third harmonic, the accumulated value in the register corresponding to the lower frequency may be dependent also on the size of the higher frequency component. With the components mentioned above, one of the accumulated values may represent the amplitude of the fundamental frequency plus one-third of the amplitude of the third harmonic. It may therefore be necessary to apply an appropriate correction to obtain a value representative of purely the lower frequency component.

In a further development of the invention, the contents of the memories represent in-phase and quadrature components of different frequencies, if necessary after correction as mentioned above and circuitry is provided for determining the modulus of the two components at each frequency using only addition, subtraction and shifting operations. The determination of the modulus (the square root of the sum of the squares of the two components) is a difficult and lengthy operation in digital equipment, even in quite sophisticated microprocessors, because of the need to provide multiplication and square root functions. A look-up table becomes excessively large for all but very modest resolutions of the input arguments. A small look-up table with linear interpolation is a possible solution but the computational complexity remains relatively high. We propose to estimate the modulus $z=(x^2+y^2)^{0.5}$ by the following equations:

$$z=x+y/2 \text{ for } 0<y<x/4$$

$$z=x+y/4 \text{ for } x/4<y<3x/4$$

$$z=x+y/8 \text{ for } 3x/4<y<7x/8$$

$$z=x/2+y/2 \text{ for } 7x/8<y<x.$$

It can be determined that the maximum error by using this procedure is of the order of 7.5% which is quite acceptable in a motor monitor where only gross changes in the individual frequency components are to be detected. The advantage of this procedure is that only addition, subtraction and shifting are required: the values y/2, y/4 and y/8 can be calculated by shifts of 1, 2 or 3 binary places, the values x/4 and x/8 can likewise be determined by shifts and the values 3x/4 and 7x/8 can be calculated by subtracting x/4 and x/8 from x, respectively. This arrangement enables the modulus to be determined with sufficient accuracy but in apparatus which does not require a multiplication function.

The invention can be embodied using hard-wired logical components, particularly adders and shift registers, but preferably a suitably programmed microprocessor is employed.

An embodiment of the invention will now be described by way of example and with reference to the accompanying drawings, in which.

Figure 1:
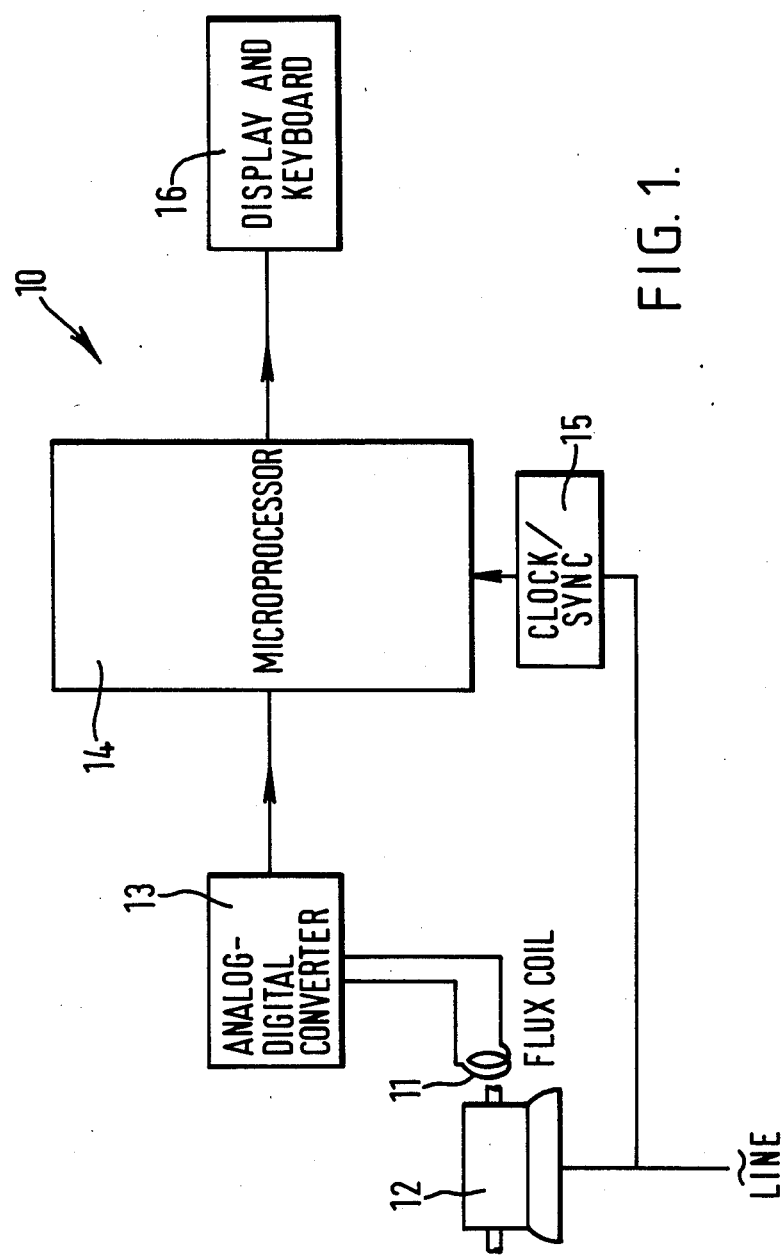
FIG. 1 is a block diagram of a motor monitor in accordance with the invention.

Referring to the drawings, the motor monitor 10 comprises a coil 11 which may be positioned so as to detect stray magnetic flux from a motor 12. Flux signals from the coil 11 are supplied to an analogue-to-digital converter 13 which supplies digital representations of the flux signals to a microprocessor 14 when commanded to do so by the microprocessor. A type 8022 or 68L05 microprocessor is suitable for this application. A line signal which powers the motor 12 is supplied to a synchronisation circuit 15 which operates to synchronise the microprocessor clock pulses with the line signal. In operation, the microprocessor commands the analogue-to-digital converter to supply digital signals representing samples of the magnetic flux at instants accurately related to the line cycle. For example, a sample may be taken every 15° of the line cycle to provide 48 samples in every two line cycles. The microprocessor performs calculations to determine the amplitudes of various frequency components of the flux signals as will be described and monitors changes in these amplitudes to provide diagnostic information which is displayed on a display 16.

Figure 2:
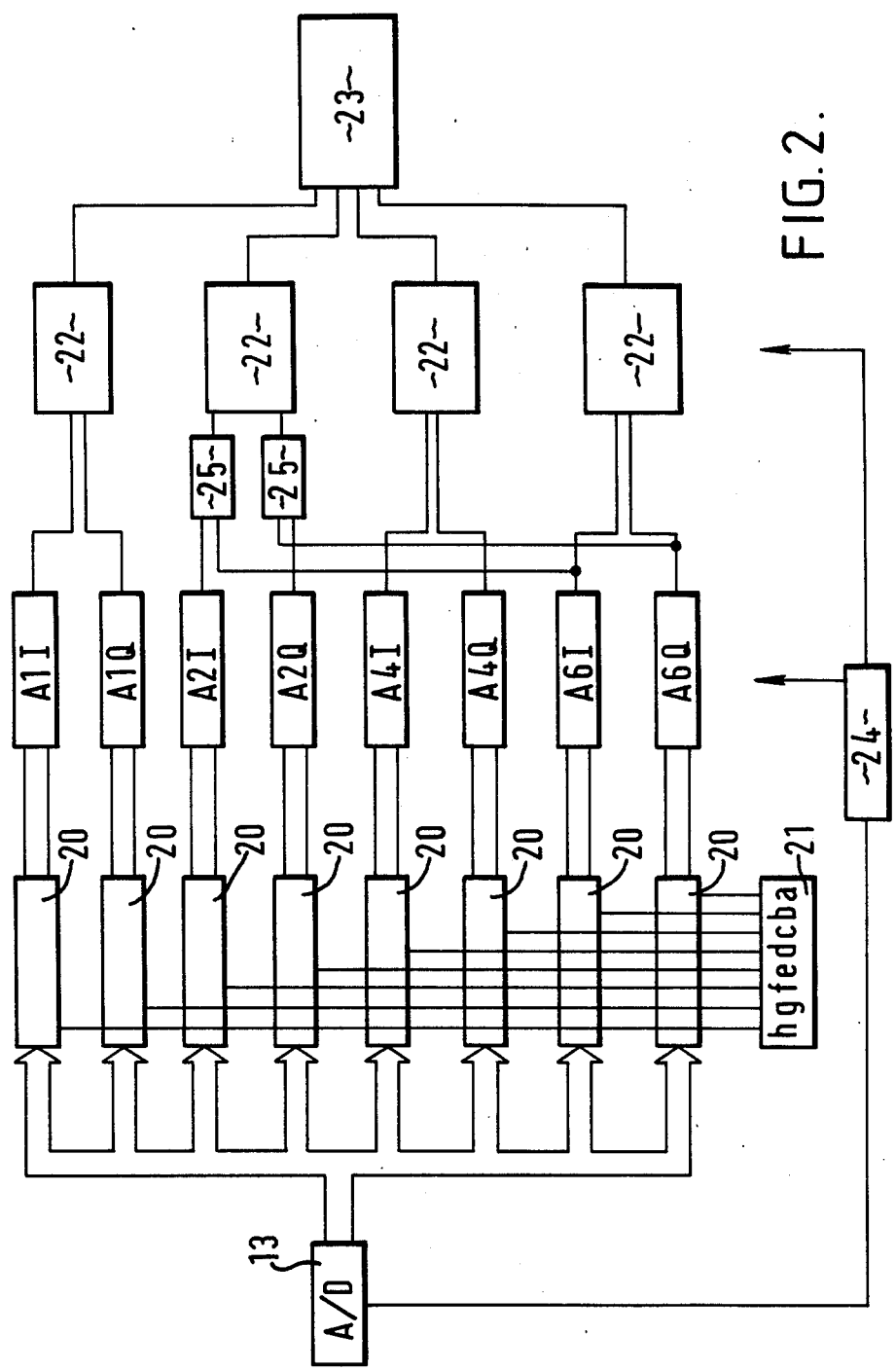
FIG. 2 is a functional block diagram illustrating the steps of the signal analysis.

FIG. 2 shows in schematic form the signal analysis operations performed by the microprocessor 14. A plurality of accumulators A1I, A1Q, A2I, A2Q, A4I, A4Q, A6I and A6Q are provided for the in-phase and quadrature components of the first, second, fourth and sixth order frequencies, respectively. The magnetic flux is sampled by analogue-to-digital converter 13° every 15° of the line signal and at each sample the detected digital value is supplied to the accumulators. The sample may be simply added to the contents of the respective accumulator or it may first be complemented at 20 and then added to the respective accumulator. Whether a sample value is complemented before adding to the respective accumulators is determined by a status register 21 which contains an eight-bit status word. Each bit controls the complementing function for one of the accumulators. This function may easily be implemented in the 8022 or 68L05 microprocessor as it is able to address, test and complement bits individually in this register. The resulting totals in each pair of in-phase and quadrature accumulators are combined at 22 to determine their modulus. The resulting values represent the amplitudes of the components of the magnetic field at 25 Hz, 50 Hz, 100 Hz and 150 Hz for a 50 Hz line frequency and these values are monitored by a monitor circuit 23 which provides an output when a significant change is detected. An example of the sequence of operations under the control of clock control 24 might be as follows: a first sample is read and added to the accumulators A1I, A2I, A4I and A6I and complemented and added to the accumulators A1Q, A2Q, A4Q and A6Q. A second sample is read after 15° of the line cycle and added or complemented and added to the accumulators as before. The last bit of the word in the status register 21 is then complemented, i.e. reversed, and so when the third sample is taken the same addition and complementing and addition operations take place except that the sample is added to accumulator A6Q without being complemented. The sixth bit of the status word is then reversed and so on the fourth sample the same operations take place except that the sample is added to register A4Q without being complemented. Similar reversals of the bits of the status register are made to control the complementing operations until 48 samples have been taken over a period of two mains cycles.

Figure 3:
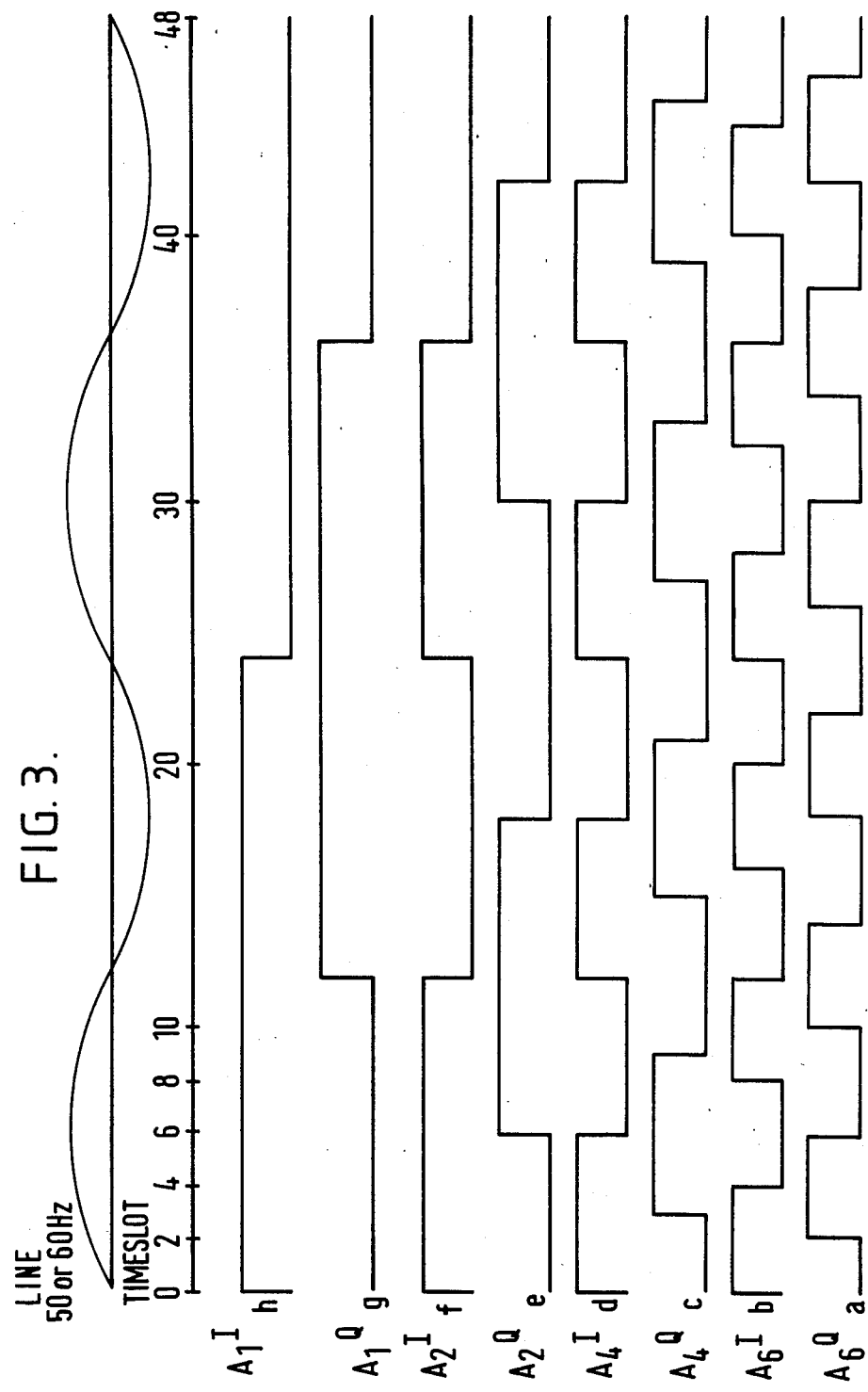
FIG. 3 is a diagram indicating which samples are added to or subtracted from the respective memories.

The reversals of the bits of the status register 21 on the sequential samples (time slots) are shown in FIG. 3. It can be seen that these are equivalent to the appropriate set of Walsh functions.

After one or more sequences of 48 samples have been processed as described above the contents of accumulators A1I and A1Q are combined to derive the modulus and hence the amplitude of the 25 Hz component. Similarly, the amplitudes of the 100 Hz and 150 Hz components are determined.

Because of the odd harmonic relation between the second and sixth order components, the contents of accumulators A2I and A2Q are influenced by the respective amplitudes of the in-phase and quadrature components of the sixth order component: in fact the contents of register A2I represents the in-phase 50 Hz component plus one third of the in-phase 150 Hz component, and similarly for register A2Q with the quadrature components. Therefore in the case of the 50 Hz component a correction is carried out by subtracting one-third of the 150 Hz component at stage 25.

Figure 4:
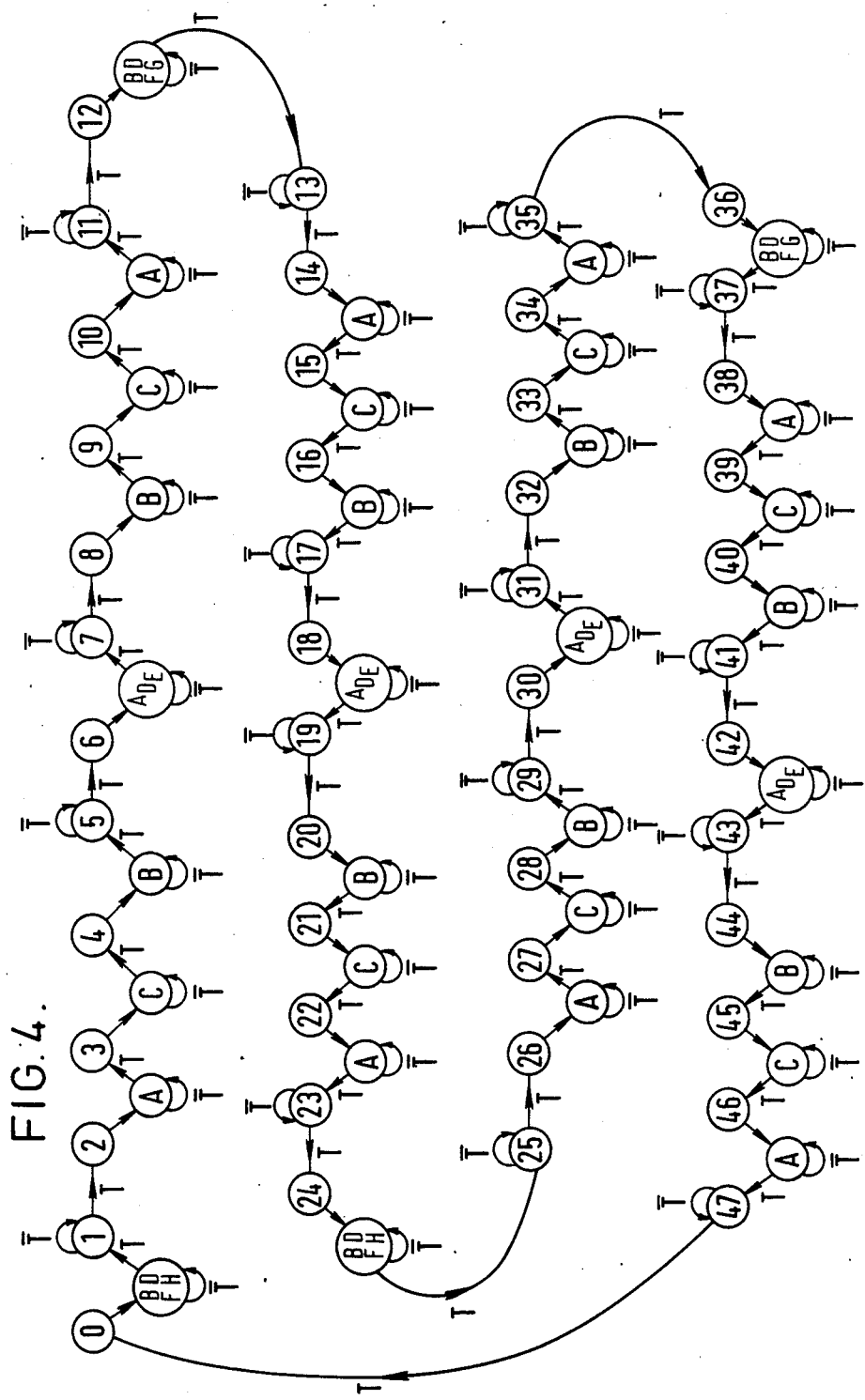
FIG. 4 is a state diagram illustrating the control of a status register which determines whether addition or subtraction of each sample is performed.

FIG. 4 is a state diagram showing which bits of the status register 21 are reversed in each time slot. The capital letters represent a reversal of the corresponding-ly-lettered bits of the status word where bit a controls the complementing of values supplied to accumulator A6Q and bit h is related to accumulator A1I, etc. Bits a to h may be termed "direction flags" as they control whether the current sample is added to or subtracted from the respective registers. In states 0 to 47 in FIG. 4 the current sample is added to or subtracted from the component registers as dictated by the respective direction flags a to h. The symbol T indicates a transition which occurs when a sample is received and the symbol $\bar{T}$ indicates that the process is waiting for a sample. During this time an analogue-to-digital conversion is carried out, all of the accumulators are updated and the indicated direction flags are reversed. Thus it may be seen that FIG. 4 is equivalent to a flow chart in which at state 0 the system waits for a sample and when it arrives direction flags b, d, f and h are reversed and the accumulators are updated in accordance with the status word and the process moves to state 1. When the next sample arrives no change to the status word is dictated and so addition and subtraction takes place as before and the process moves to state 2. Here direction flag a is reversed when a sample arrives and again the sample value is added to or subtracted from all of the accumulators in accordance with the status word. It will be seen that the state changes of the direction flags a to h are equivalent to the functions shown in FIG. 3. After the procedure has passed through 48 states it repeats.

It will be appreciated that the control of the addition and subtraction operations into the accumulators may be performed by other means, such as by employing a table of status or control words for the respective states in the sequence. Any procedure which adds or subtracts the samples in accordance with the values shown in FIG. 3 may be used but the procedure described is particularly convenient to implement in a low-cost microprocessor. The procedure described has the advantage that it requires only a small amount of storage as compared, for example, to an arrangement in which all of the samples in one sequence are stored and are subsequently processed in accordance with formulae such as the following:

$$A1I = \sum_{n=1}^{24} (t_n - t_{n+24})$$

$$A1Q = \sum_{n=1}^{12} (t_{n+12} + t_{n+24} - t_n - t_{n+36})$$

$$A6I = \sum_{n=1}^{4} (t_n + t_{n+8} + t_{n+16} + t_{n+32} + t_{n+40} -$$

$$t_{n+4} - t_{n+12} - t_{n+20} - t_{n+28} - t_{n+36} - t_{n+44})$$

$$A6Q = \sum_{n=1}^{4} (t_{n+2} + t_{n+10} + t_{n+18} + t_{n+26} + t_{n+34} +$$

$$t_{n+42} - t_{n+6} - t_{n+22} - t_{n+30} - t_{n+38}) - \sum_{n=1}^{2} (t_n + t_{n+46})$$

where $t_n$ etc, are the respective sample values.

The sampled values may be added to the accumulators for a number of line cycles before subsequent analysis is carried out. The number, e.g. 25, is suitably chosen to provide improved noise rejection whilst retaining a sufficiently rapid detection of motor faults.

As mentioned above, the invention provides a simple method of determining the modulus in step 22. The two arguments x and y are arranged such that x is the larger and the signs of x and y are discarded. The modulus is calculated as $z = x + y/2$ for $0 < y < x/4$ $z = x + y/4$ for $x/4 < y < 3x/4$ $z = x + y/8$ for $3x/4 < y < 7x/8$ $z = x/2 + y/2$ for $7x/8 < y < x$.

the value x/4 is calculated by a double right shift, x/8 by a triple right shift; the values 3x/4 and 7x/8 are calculated by subtracting these from x. The values y/2, y/4 and y/8 are calculated by shifts, as necessary and so it may be seen that the modulus may be calculated without the use of any multiplication or square root operations.

We claim:

1. A magnetic field motor monitor for monitoring a motor driven by a line supply having a line frequency, said monitor having a signal analysis system comprising means for taking instantaneous samples of the motor magnetic field at accurately determined and equally spaced times synchronized with the line frequency driving the motor, a plurality of separate memories, means for adding the current instantaneous sample value to or subtracting it from the contents of each separate memory, addition or subtraction taking place in dependence on which of the samples is being processed, and each said addition or subtraction for the sample being processed being performed before the occurrence of the next sample, means coupled to the memories for providing from the contents of the memories signals indicative of respective amplitudes of a number of harmonically related frequency components of the motor magnetic field and register means for holding a status word which determines whether the next sample is to be added to or subtracted from each seperate memory.

2. A magnetic field motor monitor as claimed in claim 1 wherein a sequence of a fixed number of equally spaced samples are taken in each cycle of the line supply or sub-harmonic thereof, and the number of the sample within the sequence determines whether addition or subtraction should take place into the respective memories.

3. A magnetic field motor as claimed in claim 1 wherein the number of memories is twice the number of frequency components the amplitudes of which are to be determined and the system includes means for providing from the contents of the memories signals representing in-phase and quadrature components of these frequencies and for determining a modulus of the in-phase and quadrature components.

4. A magnetic field motor monitor as claimed in claim 1 wherein eight memories are provided, contents of which after said adding and subtracting represent the in-phase and quadrature components of four harmonically-related frequencies.

5. A magnetic field motor as claimed in claim 1 wherein the four frequencies are 0.5, 1, 2 and 3 times the line frequency.

6. A magnetic field motor monitor as claimed in claim 1 wherein the memories are digital memories, and an analogue-to-digital converter is provided to convert sampled instantaneous values of the flux into corresponding digital values.

7. A magnetic field motor monitor as claimed in claim 1 wherein whether the samples are added to or subtracted from the respective memories is determined by a circuit which has the effect of multiplying the samples by an appropriate set of Walsh functions.

8. A magnetic field motor monitor as claimed in claim 1 wherein said register means comprises a register having the same number of bits as there are memories and arranged to hold a status word, individual bits of which represent whether the next sample is to be added or subtracted into the respective registers.

9. A magnetic field motor monitor as claimed in claim 1 wherein the contents of the memories represent in-phase and quadrature components of different frequencies, and circuitry is provided for determining a modulus of the two components at each frequency using only addition, subtraction and shifting operations.

10. A magnetic field motor monitor as claimed in claim 1 wherein said means coupled to the memories provides from the contents of the memories signals indicative of respective amplitudes to the first, second, fourth and sixth harmonically related frequency components of the motor magnetic field, means for correcting the second order component by subtracting one-third of the sixth order component.

* * * * *